(12) United States Patent
Takada et al.

(10) Patent No.: US 12,120,817 B2
(45) Date of Patent: Oct. 15, 2024

(54) RESIN MULTILAYER SUBSTRATE AND METHOD FOR MANUFACTURING RESIN MULTILAYER SUBSTRATE

(71) Applicant: Murata Manufacturing Co., Ltd., Nagaokakyo (JP)

(72) Inventors: Ryosuke Takada, Nagaokakyo (JP); Michiharu Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 240 days.

(21) Appl. No.: 17/584,589

(22) Filed: Jan. 26, 2022

(65) Prior Publication Data

US 2022/0151066 A1     May 12, 2022

Related U.S. Application Data

(63) Continuation of application No. PCT/JP2020/029985, filed on Aug. 5, 2020.

(30) Foreign Application Priority Data

Aug. 6, 2019   (JP) ................. 2019-144542

(51) Int. Cl.
*H05K 1/03*     (2006.01)
*B32B 3/26*     (2006.01)
(Continued)

(52) U.S. Cl.
CPC ........... *H05K 1/0346* (2013.01); *B32B 3/263* (2013.01); *B32B 27/08* (2013.01); *C08J 5/04* (2013.01); *C08J 5/18* (2013.01); *H05K 1/0271* (2013.01); *H05K 1/034* (2013.01); *H05K 1/0353* (2013.01); *H05K 1/0373* (2013.01); *H05K 3/4626* (2013.01); *C08J 2325/04* (2013.01); *C08J 2327/12* (2013.01); *C08J 2365/00* (2013.01);
(Continued)

(58) Field of Classification Search
None
See application file for complete search history.

(56) References Cited

U.S. PATENT DOCUMENTS

| 4,161,470 | A | 7/1979 | Calundann |
| H1502 | H | 11/1995 | Allan et al. |

(Continued)

FOREIGN PATENT DOCUMENTS

| CA | 2106470 A1 | 9/1992 |
| CN | 101766063 A | 6/2010 |

(Continued)

OTHER PUBLICATIONS

International Search Report issued in PCT/JP2020/029985, dated Sep. 29, 2020.

(Continued)

*Primary Examiner* — Timothy J Thompson
*Assistant Examiner* — Harmandeep Singh
(74) *Attorney, Agent, or Firm* — ArentFox Schiff LLP

(57) ABSTRACT

A resin multilayer substrate that includes a substrate having a plurality of laminated resin layers containing a norbornene-based polymer. A resin layer has an altered portion altered by a surface treatment and formed at an interface with a resin layer adjacent thereto in a lamination direction. An adhesion at an interface having the altered portion is greater than an adhesion at an interface with a non-altered portion.

20 Claims, 6 Drawing Sheets

(51) Int. Cl.
  *B32B 27/08* (2006.01)
  *C08J 5/04* (2006.01)
  *C08J 5/18* (2006.01)
  *H05K 1/02* (2006.01)
  *H05K 3/46* (2006.01)
  *H05K 1/11* (2006.01)

(52) U.S. Cl.
  CPC ...... *H05K 1/118* (2013.01); *H05K 2201/0141* (2013.01); *H05K 2201/068* (2013.01); *H05K 2203/065* (2013.01)

(56) References Cited

U.S. PATENT DOCUMENTS

| | | | |
|---|---|---|---|
| 5,861,462 | A | 1/1999 | Sasaki et al. |
| 6,067,392 | A | 5/2000 | Wakami et al. |
| 7,582,339 | B2 | 9/2009 | Kim et al. |
| 8,440,117 | B2 | 5/2013 | Kim et al. |
| 8,801,978 | B2 | 8/2014 | Kim et al. |
| 9,024,198 | B2 | 5/2015 | Kajiya et al. |
| 10,507,631 | B2 | 12/2019 | Terada et al. |
| 10,745,621 | B2 | 8/2020 | Lee |
| 11,224,119 | B2 | 1/2022 | Koyama |
| 11,259,401 | B2 | 2/2022 | Koyama |
| 2002/0045042 | A1 | 4/2002 | Ikegawa et al. |
| 2006/0105117 | A1 | 5/2006 | Kim et al. |
| 2009/0295000 | A1 | 12/2009 | Kim et al. |
| 2010/0210803 | A1 | 8/2010 | Cho et al. |
| 2010/0252310 | A1 | 10/2010 | Kojima et al. |
| 2013/0334718 | A1 | 12/2013 | Kim et al. |
| 2015/0294754 | A1 | 10/2015 | Ohata |
| 2019/0030870 | A1 | 1/2019 | Terada et al. |
| 2019/0078022 | A1 | 3/2019 | Lee |
| 2019/0080817 | A1 | 3/2019 | Ohata |
| 2020/0267831 | A1 | 8/2020 | Koyama |
| 2020/0267832 | A1 | 8/2020 | Koyama |

FOREIGN PATENT DOCUMENTS

| | | |
|---|---|---|
| CN | 108925132 A | 11/2018 |
| EP | 0499387 A2 | 8/1992 |
| JP | H03160079 A | 7/1991 |
| JP | 104348139 A | 12/1992 |
| JP | H04348139 A | 12/1992 |
| JP | 2002265729 A | 9/2002 |
| JP | 2003171538 A | 6/2003 |
| JP | 2003200534 A | 7/2003 |
| JP | 2005268365 A | 9/2005 |
| JP | 2009137290 A | 6/2009 |
| JP | 2010065206 A | 3/2010 |
| JP | 2010189619 A | 9/2010 |
| JP | 2010286837 A | 12/2010 |
| JP | 2012121956 A | 6/2012 |
| JP | 2012160741 A | 8/2012 |
| JP | 2013151638 A | 8/2013 |
| JP | 5904307 B2 | 4/2016 |
| JP | 2017164905 A | 9/2017 |
| JP | 2019052288 A | 4/2019 |
| JP | 2019065061 A | 4/2019 |
| WO | 9216585 A1 | 10/1992 |
| WO | 2019098011 A1 | 5/2019 |
| WO | 2019098012 A1 | 5/2019 |

OTHER PUBLICATIONS

Written Opinion of the International Search Report issued in PCT/JP2020/029985, dated Sep. 29, 2020.
International Search Report issued in PCT/JP2020/029986, dated Sep. 29, 2020.
Written Opinion of the International Search Report issued in PCT/JP2020/029986, dated Sep. 29, 2020.

(1)

(2)

(3)

(4)

RESIN MULTILAYER SUBSTRATE AND METHOD FOR MANUFACTURING RESIN MULTILAYER SUBSTRATE

CROSS REFERENCE TO RELATED APPLICATIONS

The present application is a continuation of International application No. PCT/JP2020/029985, filed Aug. 5, 2020, which claims priority to Japanese Patent Application No. 2019-144542, filed Aug. 6, 2019, the entire contents of each of which are incorporated herein by reference.

FIELD OF THE INVENTION

The present invention relates to a resin multilayer substrate formed by laminating a plurality of resin layers and a method for manufacturing a resin multilayer substrate.

BACKGROUND OF THE INVENTION

A norbornene-based polymer conventionally known as a material having a low dielectric constant and a low loss is known as a material for use in a high-frequency circuit board (Patent Document 1).

Patent Document 1: Japanese Patent Application Laid-Open No. 2010-65206

SUMMARY OF THE INVENTION

However, resin layers containing a norbornene-based polymer have a low adhesion, and it is difficult to form a multilayer substrate by laminating these resin layers.

An object of the present invention is to provide a resin multilayer substrate having an improved adhesion of an interface between resin layers in a configuration in which a plurality of resin layers containing a norbornene-based polymer are laminated, and a method for manufacturing a resin multilayer substrate.

A resin multilayer substrate of the present invention includes a substrate having a plurality of laminated resin layers,
in which the plurality of laminated resin layers include two first resin layers adjacent to each other in a lamination direction among the plurality of laminated resin layers, the two first resin layers each comprising a norbornene-based polymer having at least one repeating unit represented by the below formula (1), at least one of the two first resin layers that are adjacent to each other in the lamination direction has an interface with an altered portion, and
an adhesion at the interface having the altered portion is greater than an adhesion at an interface with a non-altered portion,

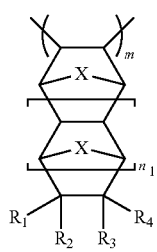

(1)

where X represents O, —CH$_2$—, or —CH$_2$—CH$_2$—; each of substituents R$_1$, R$_2$, R$_3$, and R$_4$ represents (1) hydrogen, (2) a linear or branched organic group, or (3) a group containing a group selected from derivatives in which a part of the linear or branched organic group is substituted with a halogen or nitrile group, wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other; m is an integer of 10 to 10,000; and n$_1$ is an integer of 0 to 5.

A resin multilayer substrate of the present invention includes a substrate having a plurality of laminated resin layers,
in which the plurality of laminated resin layers include a plurality of first resin layers and a second resin layer, where at least one first resin layer of the plurality of first resin layers is bonded to the second resin layer, and the plurality of first resin layers comprise a norbornene-based polymer having at least one repeating unit represented by the following formula (1),
an adhesion of the second resin layer to the at least one first resin layer is higher than an adhesion between the plurality of first resin layers,

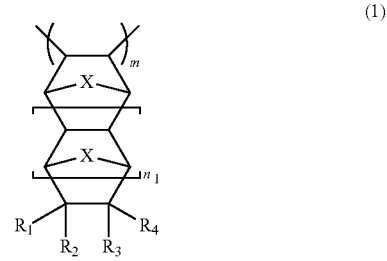

(1)

where X represents O, —CH$_2$—, or —CH$_2$—CH$_2$—; each of substituents R$_1$, R$_2$, R$_3$, and R$_4$ represents (1) hydrogen, (2) a linear or branched organic group, or (3) a group containing a group selected from derivatives in which a part of the linear or branched organic group is substituted with a halogen or nitrile group, the linear or branched organic group is an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other; m is an integer of 10 to 10,000; and n$_1$ is an integer of 0 to 5.

A method for manufacturing a resin multilayer substrate includes forming a substrate by laminating a plurality of resin layers together,
in which the plurality of resin layers include two first resin layers adjacent to each other in a lamination direction among the plurality of laminated resin layers, the two first resin layers each comprising a norbornene-based polymer having at least one repeating unit represented by the following formula (1), and reacting the norbornene-based polymer of at least one of the two first resin layers with an additive by a surface treatment to generate a gradient in a composition of the at least one of the two first resin layers between a material before the reaction and the material after the reaction in a thickness direction according to attenuation of an effect of the surface treatment,

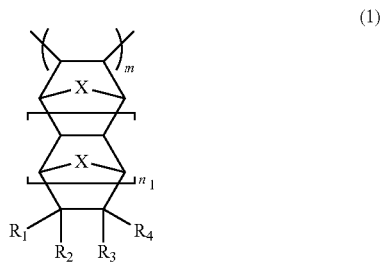

(1)

where X represents O, —CH$_2$—, or —CH$_2$—CH$_2$—; each of substituents R$_1$, R$_2$, R$_3$, and R$_4$ represents (1) hydrogen, (2) a linear or branched organic group, or (3) a group containing a group selected from derivatives in which a part of the linear or branched organic group is substituted with a halogen or nitrile group, the linear or branched organic group is an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other; m is an integer of 10 to 10,000; and n$_1$ is an integer of 0 to 5.

According to this configuration, since the adhesion between the plurality of first resin layers containing a norbornene-based polymer is increased, it is possible to realize a resin multilayer substrate having a low dielectric constant and a low loss in which the plurality of first resin layers are laminated.

According to the present invention, it is possible to realize a resin multilayer substrate in which an adhesion of an interface between resin layers is increased in a configuration in which a plurality of resin layers obtained using a norbornene-based polymer are laminated.

DETAILED DESCRIPTION OF THE INVENTION

Figure 1A:
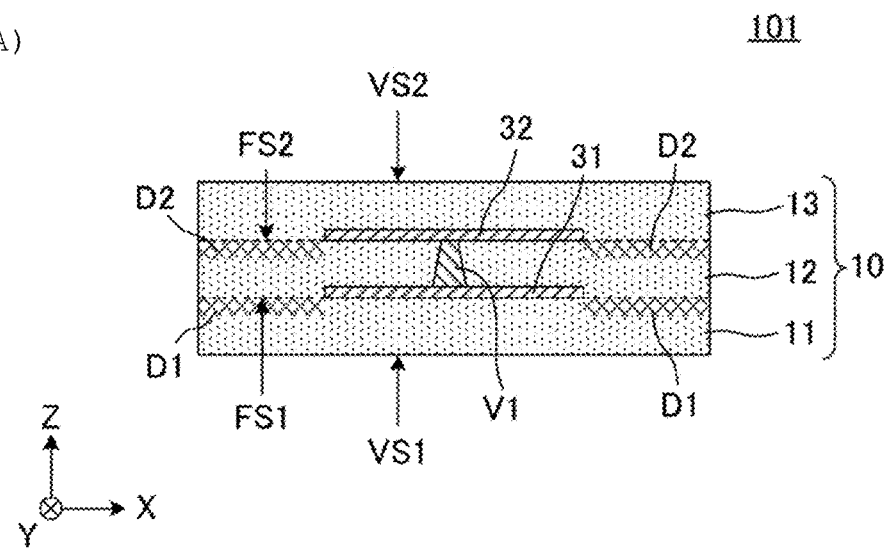
FIG. 1(A) is a sectional view of a resin multilayer substrate 101 according to a first embodiment.

Hereinafter, a plurality of embodiments for implementing the present invention will be described with some specific examples with reference to the drawings. In each of the drawings, the same portions are denoted by the same reference numerals. In consideration of the description of the main points or ease of understanding, the embodiments are described separately for convenience, but a partial replacement or combination of the configurations shown in different embodiments is possible. In the second and subsequent embodiments, descriptions of matters similar to those in the first embodiment will be omitted, and only different points will be described. In particular, the same operation and effect by the same configuration will not be sequentially mentioned for each embodiment.

First Embodiment

Figure 1B:
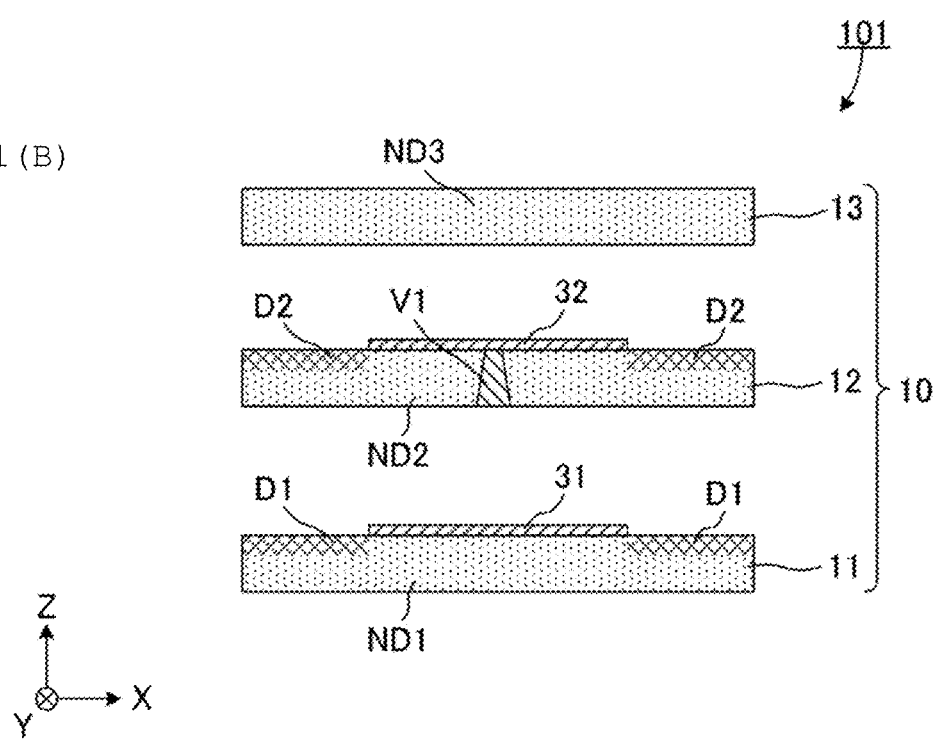
FIG. 1(B) is an exploded sectional view of the resin multilayer substrate 101.

FIG. 1(A) is a sectional view of a resin multilayer substrate 101 according to a first embodiment, and FIG. 1(B) is an exploded sectional view of the resin multilayer substrate 101. In FIGS. 1(A) and 1(B), altered portions D1 and D2 are indicated by cross hatching for easy understanding of a structure.

The resin multilayer substrate 101 includes a substrate 10, conductor patterns 31 and 32, an interlayer connection conductor V1, and the like. The resin multilayer substrate 101 includes other configurations, but the other configurations are not illustrated in FIGS. 1(A) and 1(B).

The substrate 10 is a flexible rectangular flat plate, and has a first main surface VS1 and a second main surface VS2 facing each other. The conductor patterns 31 and 32 and the interlayer connection conductor V1 are formed inside the substrate 10.

The substrate 10 is formed by sequentially laminating first resin layers 11, 12, and 13. The first main surface VS1 and the second main surface VS2 are surfaces orthogonal to a lamination direction (Z-axis direction) of the plurality of first resin layers 11 to 13. The first resin layers 11, 12, and 13 are, for example, resin sheets obtained using a norbornene-based polymer having at least one repeating unit represented by the following formula (1):

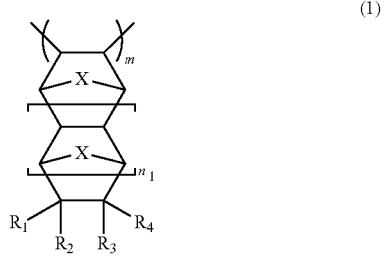

(1)

In formula (1), X represents O, —CH$_2$—, or —CH$_2$—CH$_2$—; each of substituents R$_1$, R$_2$, R$_3$, and R$_4$ represents (1) hydrogen, (2) a linear or branched organic group, or (3) a group containing a group selected from derivatives in which a part of the linear or branched organic group is substituted with a halogen or nitrile group, wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other; m is an integer of 10 to 10,000; and n$_1$ is an integer of 0 to 5.

The substituents R$_1$, R$_2$, R$_3$, and R$_4$ of an addition-type polynorbornene having a structure represented by formula (1) can be formed to have predetermined characteristics by adjusting a type and a proportion of the repeating unit according to a purpose thereof. Preferably, X is —CH$_2$—; m is 1,000 or more; n$_1$ is 0 or 1; and it is preferable that at least one of R$_1$, R$_2$, R$_3$, and R$_4$ contains an ester group, an ether group, or a hydroxyl group. More preferably, m is 5,000 or more; n$_1$ is 0; and it is preferable that at least one of R$_1$, R$_2$, R$_3$, and R$_4$ contains an ester group or a hydroxyl group.

Examples of the alkyl group include a linear or branched saturated hydrocarbon having 1 to 10 carbon atoms and a cyclic saturated hydrocarbon. Examples of the alkenyl group include vinyl, allyl, butynyl, and cyclohexenyl groups. Examples of the alkynyl group include ethynyl, 1-propynyl, 2-propynyl, 1-butynyl, 2-butynyl, hexynyl, octynyl, and heptynyl groups. Examples of the aryl group include phenyl, tolyl, naphthyl, and anthracenyl groups. In addition, examples of the aralkyl group include benzyl and phenethyl groups. An example of the epoxy group includes a glycidyl ether group, and examples of the alkoxysilyl group include trimethoxysilyl, triethoxysilyl, and triethoxysilylethyl groups. An example of the (meth)acrylic group includes a methacryloxymethyl group, and examples of the ester group include methyl ester, ethyl ester, n-propyl ester, n-butyl ester, and t-butyl ester groups.

The conductor pattern 31 is formed on a surface of the first resin layer 11. The conductor pattern 31 is a rectangular conductor pattern disposed near the center of the first resin layer 11. The conductor pattern 31 is, for example, a conductor pattern such as a Cu foil. In addition, the first resin layer 11 has the altered portion D1 altered by a surface treatment (to be described in detail below) and formed on the surface (interface FS1 with the first resin layer 12 adjacent thereto and in close contact therewith in the Z-axis direction) thereof. The altered portion D1 is a portion having an adhesion to the first resin layer (altered portion or non-altered portion) higher than an adhesion between non-altered portions ND1, ND2, and ND3 (portions other than the altered portions D1 and D2 of the first resin layers 11 to 13 in FIGS. 1(A) and 1(B). That is, an adhesion between the altered portions D1 and an adhesion between the non-altered portions ND1, ND2, and ND3 and the altered portion D1 are higher than the adhesion between the non-altered portions ND1, ND2, and ND3. Specifically, the altered portion D1 of the present embodiment has a glass transition temperature (Tg) lower than that of the non-altered portion ND1.

The conductor pattern 32 is formed on a surface of the first resin layer 12. The conductor pattern 32 is a rectangular conductor pattern disposed near the center of the first resin layer 12. The conductor pattern 32 is, for example, a conductor pattern such as a Cu foil. In addition, the interlayer connection conductor V1 is formed in the first resin layer 12. Further, the first resin layer 12 has the altered portion D2 altered by a surface treatment (to be described in detail below) and formed on the surface (interface FS2 with the first resin layer 13 adjacent thereto and in close contact therewith in the Z-axis direction) thereof. The altered portion D2 is a portion having an adhesion to the first resin layer (altered portion or non-altered portion) higher than the adhesion between the non-altered portions ND1, ND2, and ND3. Specifically, the altered portion D2 of the present embodiment has a glass transition temperature (Tg) lower than that of the non-altered portion ND2.

As illustrated in FIG. 1(A), the conductor patterns 31 and 32 are electrically connected with the interlayer connection conductor V1 interposed therebetween.

As described above, the adhesion of the altered portions D1 and D2 to the first resin layers 11 and 12 is higher than the adhesion between the non-altered portions ND1, ND2, and ND3. Specifically, each of the altered portions D1 and D2 of the present embodiment has a glass transition temperature (Tg) lower than those of the non-altered portions ND1, ND2, and ND3. In general, a main chain skeleton of the norbornene-based polymer has a high glass transition temperature of around 300° C. and low molecular mobility with respect to heat. On the other hand, according to the above configuration, molecular mobility of each of the altered portions D1 and D2 positioned at the interfaces FS1 and FS2 between the first resin layers with respect to heat is higher than those of the non-altered portions ND1 and ND2. Therefore, the adhesion between the plurality of first resin layers 11 to 13 is increased, and a resin multilayer substrate having a low dielectric constant and a low loss (low dielectric loss tangent) can be realized using the first resin layers 11 to 13.

When a peeling test is performed, in the resin multilayer substrate 101, the interfaces between the first resin layers 11 to 13 are not peeled off, and cohesive fracture occurs inside any one of the first resin layers 11 to 13. The "cohesive fracture" used here means, for example, a case where (cohesive fracture rate)/(interface fracture rate) as an area ratio is 10% or more. The (cohesive fracture rate)/(interface fracture rate) as an area ratio is preferably 50% or more and more preferably 80% or more. The peeling test is, for example, a 90 degree peeling strength test (IPC-TM-650 2.4.9 or JIS C 6471 8.1) or a land-pull strength test. In addition, the "cohesive fracture" in the present specification means that fracture occurs not at the interface between the resin layers but inside the resin layer.

The altered portions D1 and D2 of the present embodiment are not formed at portions (portions where the first resin layers 11 to 13 are bonded to each other with the conductor patterns 31 and 32 interposed therebetween) in contact with the conductor patterns 31 and 32 at the interfaces FS1 and FS2 of the first resin layers 11 to 13. However, after the substrate 10 is formed by laminating the plurality of first resin layers 11 to 13 (after heating press), the resin constituting the first resin layers 11 to 13 enters into fine irregularities formed on surfaces of the conductor patterns 31 and 32 (anchor effect or anchoring effect). Therefore, in the substrate 10, the adhesion between the first resin layers 11 to 13 formed with the conductor patterns 31 and 32 interposed therebetween is high.

Figure 2:
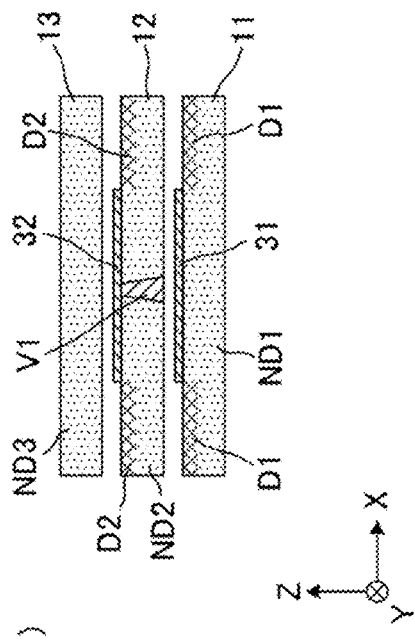
FIG. 2 is a sectional view sequentially illustrating a method for manufacturing a resin multilayer substrate 101.
Figure 2:
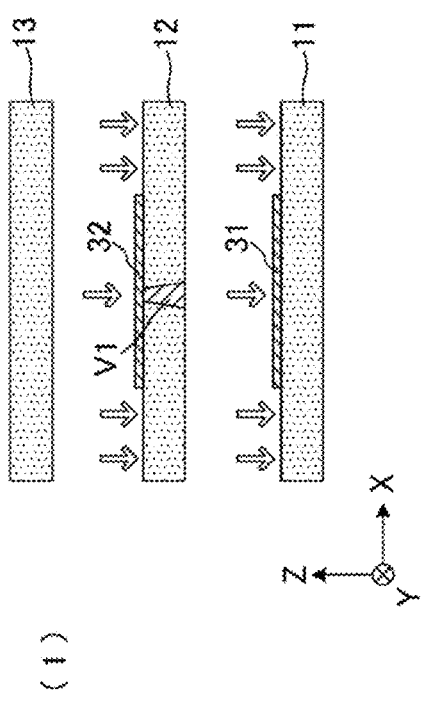
Figure 2:
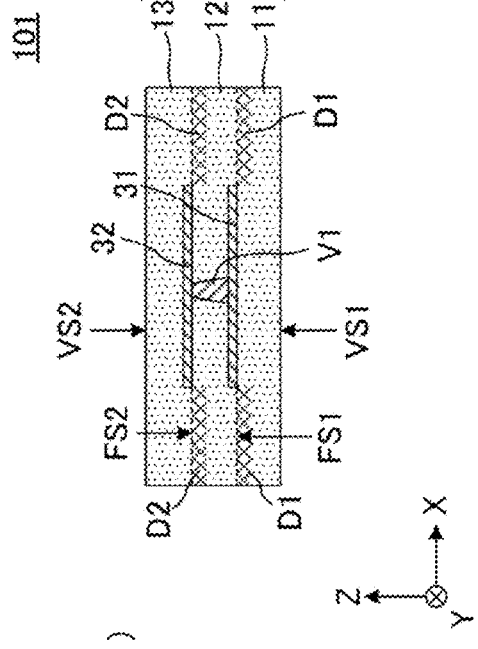
Figure 2:
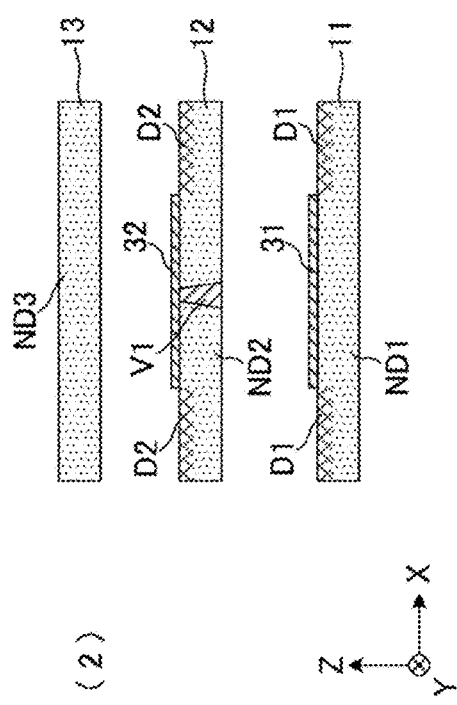

The resin multilayer substrate 101 according to the present embodiment is manufactured by, for example, by the following manufacturing method. FIG. 2 is a sectional view sequentially illustrating a method for manufacturing a resin multilayer substrate 101. In FIG. 2, for convenience of description, a manufacturing process with one chip (individual piece) will be described, and an actual manufacturing process of the resin multilayer substrate 101 is performed in a collective board state. The "collective board" refers to a substrate including a plurality of resin multilayer substrates 101.

First, as illustrated in (1) of FIG. 2, the plurality of first resin layers 11, 12, and 13 are prepared. The first resin layers 11 to 13 are, for example, sheets obtained using a norbornene-based polymer.

Next, the conductor patterns 31 and 32 are formed in the first resin layers 11 and 12, respectively. Specifically, a metal foil (for example, a Cu foil) is laminated on the surfaces of the first resin layers 11 and 12, and the metal foil is patterned by photolithography. Therefore, the conductor pattern 31 is formed on the surface of the first resin layer 11, and the conductor pattern 32 is formed on the surface of the first resin layer 12.

In addition, the interlayer connection conductor V1 is formed in the first resin layer 12. The interlayer connection conductor V1 is provided by, for example, providing a hole in the first resin layer 12 by a laser irradiation, a drill, or the like, disposing (filling) a conductive paste containing a metal power such as Cu, Sn, or an alloy thereof and a resin material in the hole, and solidifying the conductive paste by subsequent heating press.

Next, as illustrated in (2) of FIG. 2, the surfaces of the first resin layers 11 and 12 are altered by a surface treatment. Specifically, the surface of the first resin layer 11 is subjected to any one of plasma discharge, corona discharge, electron beam irradiation, laser irradiation, and light irradiation (for example, a UV treatment) (see a white arrow illustrated in (2) of FIG. 2). Therefore, the altered portion D1 is formed at a part of the surface of the first resin layer 11 (a portion at which the conductor pattern 31 is not formed or a portion to be an interface with the first resin layer 12 at the time of subsequent lamination). In addition, the altered portion D2 is formed at a part of the surface of the first resin layer 12 (a portion at which the conductor pattern 32 is not formed or a portion to be an interface with the first resin layer 13 at the time of subsequent lamination).

In the present embodiment, the glass transition temperature (Tg) of each of the altered portions D1 and D2 is altered to be lower than those of the non-altered portions ND1, ND2, and ND3.

Next, as illustrated in (3) of FIG. 2, the first resin layers 11, 12, and 13 are sequentially laminated (mounted). When the first resin layers are laminated, the altered portion D1 of the first resin layer 11 abuts on the first resin layer 12 (the non-altered portion ND2) adjacent thereto in the Z-axis direction, and the altered portion D2 of the first resin layer 12 abuts on the first resin layer 13 (the non-altered portion ND3) adjacent thereto in the Z-axis direction.

Therefore, the plurality of laminated first resin layers 11 to 13 are heat-pressed (collectively pressed) to form the substrate 10 (resin multilayer substrate 101) illustrated in (4) of FIG. 2.

According to the manufacturing method, the altered portions D1 and D2 having high molecular mobility with respect to heat (a low glass transition temperature) are provided at the interface with the other first resin layer of the first resin layers 11 and 12. Therefore, as compared with the case where the non-altered portions ND1, ND2, and ND3 of the first resin layers 11 to 13 are directly bonded to each other, a resin multilayer substrate in which an adhesion of an interface between a plurality of resin layers is high can be easily manufactured.

In addition, according to the manufacturing method, since the substrate 10 can be easily formed by heat-pressing (collectively pressing) the laminated first resin layer 11, 12, and 13, the manufacturing process of the resin multilayer substrate 101 can be reduced and a cost can be reduced. In addition, according to the manufacturing method, it is possible to easily manufacture a resin multilayer substrate capable of implementing plastic deformation and maintaining (holding) a desired shape.

Further, according to the manufacturing method, since the conductive paste is disposed in the hole provided in the first resin layer 12, and the conductive paste is solidified by the heating press (collective press) to form the interlayer connection conductor V1, the formation becomes easy. That is, since the interlayer connection conductor V1 can also be formed simultaneously by the heating press treatment of the laminated first resin layers 11 to 13, the number of steps can be reduced as compared with a case where the interlayer connection conductor is formed by through-hole plating or the like.

Figure 3:
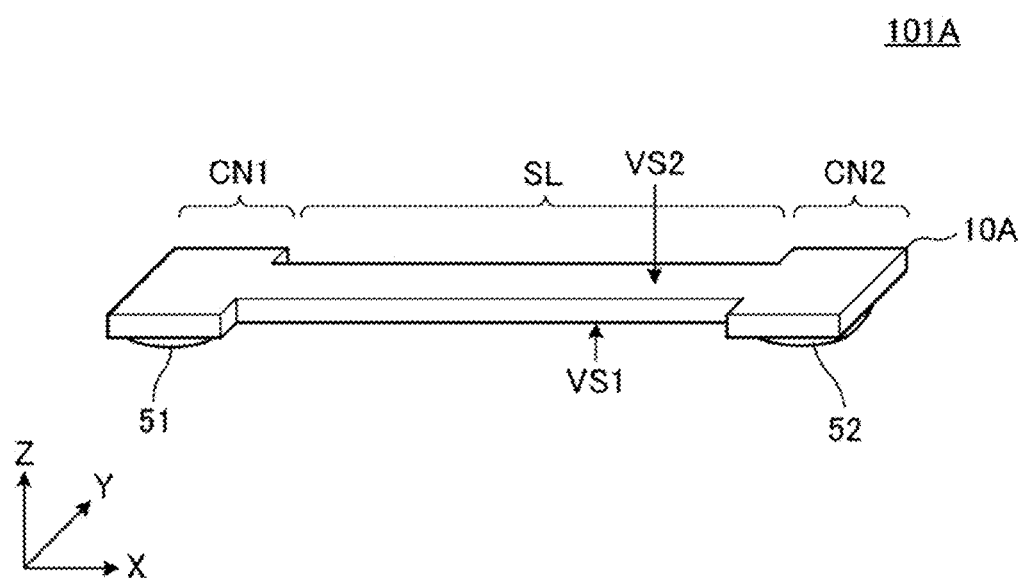
FIG. 3 is an external perspective view of a resin multilayer substrate 101A according to the first embodiment.
Figure 4A:
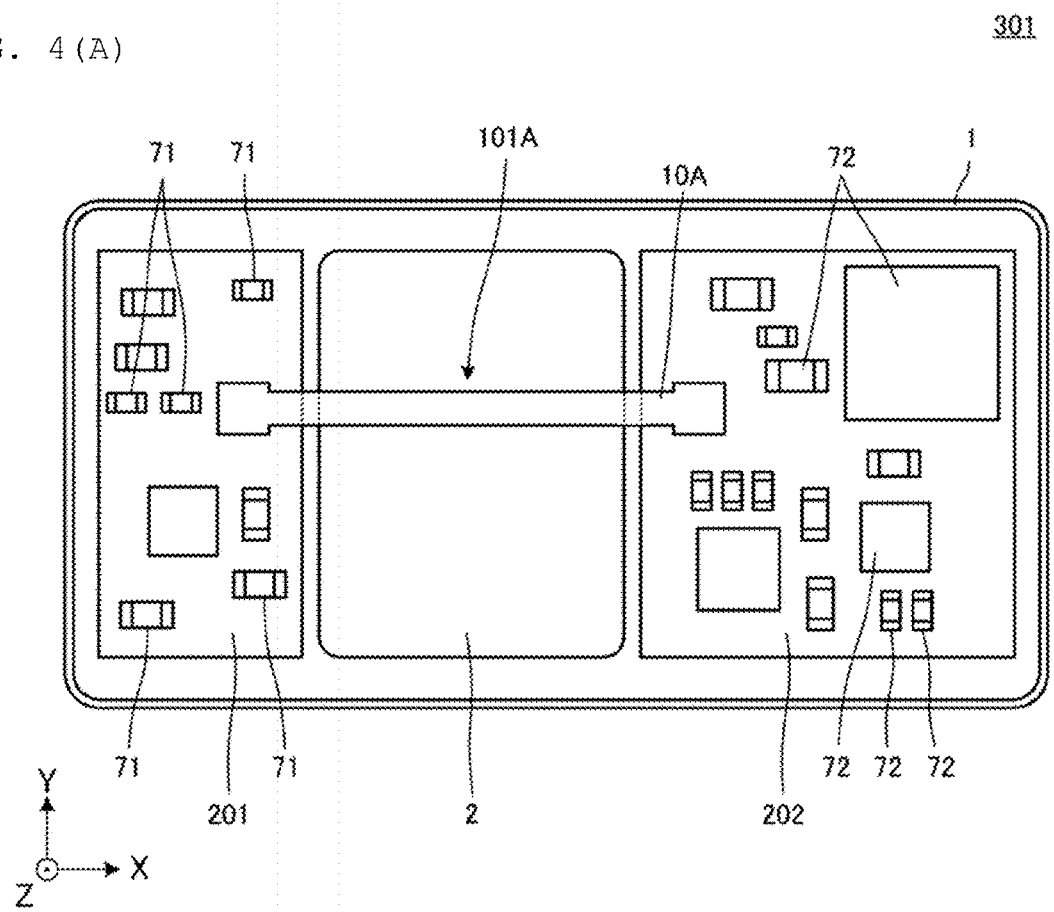
FIG. 4(A) is a plan view of the inside of a housing 1 of an electronic device 301 using the resin multilayer substrate 101A.
Figure 4B:
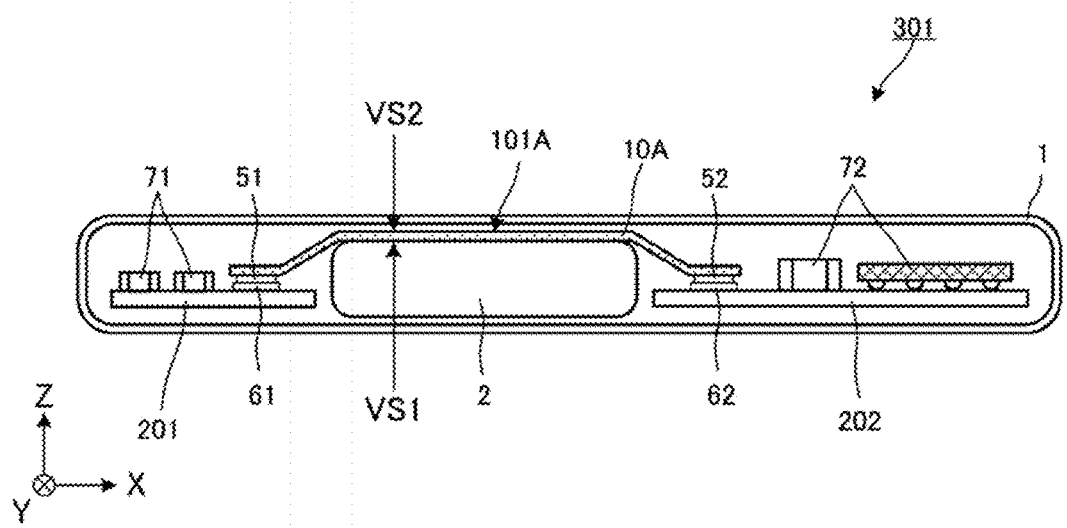
FIG. 4(B) is a sectional view of the electronic device 301.

The resin multilayer substrate of the present invention is used, for example, as follows. FIG. 3 is an external perspective view of a resin multilayer substrate 101A according to the first embodiment. FIG. 4(A) is a plan view of the inside of a housing 1 of an electronic device 301 using the resin multilayer substrate 101A, and FIG. 4(B) is a sectional view of the electronic device 301.

The electronic device 301 includes the resin multilayer substrate 101A, the housing 1, a battery pack 2, circuit boards 201 and 202, electronic components 71 and 72, and the like. The electronic device 301 includes other elements, but the other elements are not illustrated in FIG. 4(B).

The resin multilayer substrate 101A is, for example, a cable that connects a plurality of circuit boards. As illustrated in FIG. 3, the resin multilayer substrate 101A includes connection portions CN1 and CN2 and a line portion SL. The connection portions CN1 and CN2 are portions connected to different circuit boards. Although not illustrated, a transmission line connecting the connection portions CN1 and CN2 is formed in the line portion SL. In the resin multilayer substrate 101, the connection portion CN1, the line portion SL, and the connection portion CN2 are arranged in this order in a +X direction.

The resin multilayer substrate 101A includes a substrate 10A, plugs 51 and 52, and the like. The substrate 10A is a substantially rectangular flat plate whose longitudinal direction coincides with the X-axis direction. A basic configuration of the resin multilayer substrate 101A is substantially the same as that of the resin multilayer substrate 101 described above. The plug 51 is provided in the connection portion CN1, and the plug 52 is provided in the connection portion CN2.

As illustrated in FIGS. 4(A) and 4(B), the resin multilayer substrate 101A, the battery pack 2, the circuit boards 201 and 202, the electronic components 71 and 72, and the like are arranged in the housing 1. The circuit boards 201 and 202 are, for example, printed wiring boards. Each of the electronic components 71 and 72 is, for example, a chip component such as a chip inductor and a chip capacitor, an RFIC element, an antenna device, an impedance matching circuit, or the like.

A plurality of electronic components 71 are mounted on a surface of the circuit board 201, and a plurality of electronic components 72 are mounted on a surface of the circuit board 202. The battery pack 2 is arranged between the circuit boards 201 and 202. The resin multilayer substrate 101A connects the circuit boards 201 and 202. Specifically, the plug 51 of the resin multilayer substrate 101A is connected to a receptacle 61 arranged on the surface of the circuit board 201. In addition, the plug 52 of the resin multilayer substrate 101A is connected to a receptacle 62 arranged on the surface of the circuit board 201.

The surfaces of the circuit boards 201 and 202 and an upper surface of the battery pack 2 have different heights in the Z-axis direction. The resin multilayer substrate 101A is connected to each of the circuit boards 201 and 202 in a bent state (a state in which only the line portion of the resin multilayer substrate 101A is in contact with the upper surface of the battery pack 2). That is, the substrate 10A of the resin multilayer substrate 101A has a bent portion.

As described above, since the resin multilayer substrate 101A of the present invention has a high adhesion between the resin layers and can suppress peeling (delamination) at the interface between the resin layers, the resin multilayer substrate can also be used in the case of bending and connecting the resin layers.

<<Modified Example of Altered Portion>>

In the present embodiment, the example in which the altered portions D1 and D2 having a glass transition temperature lower than those of other portions (non-altered portions ND1 to ND3) are formed in the first resin layers 11 and 12 has been described, but the altered portion having high molecular mobility with respect to heat is not limited thereto. For example, in a case where a loss tangent of each of the altered portions D1 and D2 is greater than those of the non-altered portions ND1 to ND3, the adhesion between the first resin layers is increased. The loss tangent (tan δ) is calculated by the following equation:

$$\tan \delta = \frac{E''}{E'}$$

E″: Imaginary part of complex elastic modulus (loss elastic modulus)
E′: Real part of complex elastic modulus (storage elastic modulus)

The loss elastic modulus (E″), the storage elastic modulus (E′), and the loss tangent (tan δ) are measured by, for example, dynamic viscoelasticity measurement.

In addition, in the present embodiment, the altered portions D1 and D2 having a high adhesion to the first resin layer by increasing molecular mobility with respect to heat have been described, the altered portion of the present invention is not limited thereto. The altered portion may be a portion having a high adhesion to the first resin layer by a chemical reaction, bonding, and the like. For example, when the altered portion is a portion having more functional groups of the norbornene-based polymer than in the non-altered portion, the adhesion to the first resin layer is increased. The functional group is, for example, an organic group such as a hydroxyl group or a carboxylic acid.

<<Addition of Additive to First Resin Layer>>

In addition, an additive (for example, a known deterioration inhibitor, ultraviolet inhibitor, ultraviolet absorber, plasticizer, infrared absorbent, or the like) having a predetermined function according to an application may be added (kneaded, applied, segregated, or the like) to each of the first resin layers 11 to 13 in a manufacturing process of the resin layer. Examples of the type of the additive include (a) a material added to the first resin layer to promote a surface treatment and (b) a material added to change physical properties or chemical properties of the first resin layer.

(a) Case where Additive is Material Added to First Resin Layer to Promote Surface Treatment For example, in a case where the first resin layer is subjected to a surface treatment by a UV treatment, it is preferable to add a material having a function of enhancing UV absorbency to the first resin layers 11 and 12 in advance as an additive.

(b) Case where Additive is Material Added to Change Physical Properties or Chemical Properties of First Resin Layer The additive may be, for example, a known stabilizer, deterioration inhibitor, ultraviolet inhibitor, plasticizer, infrared absorber, or the like, or may be a material having a function of lowering (or increasing the loss tangent) the glass transition temperature of each of the first resin layers 11 to 13. As an example, in a case where ester is contained in each of the first resin layers 11 to 13, a long-chain carboxylic acid (or a long-chain alcohol) is added to each of the first resin layers 11 to 13 as an additive to cause transesterification, such that the glass transition temperature can be lowered. Specifically, in a case where the substituents $R_1$, $R_2$, $R_3$, and $R_4$ of formula (1) are alcohols, a long-chain carboxylic acid (R—COOH) is added, and in a case where the substituents $R_1$, $R_2$, $R_3$, and $R_4$ are carboxylic acids, an alcohol may be added.

In addition, the additive may be, for example, a material having a function of enhancing flexibility of each of the first resin layers 11 to 13. As an example, the additive may be a ring-opening olefin polymer (COC/COP) having at least one cyclic repeating unit represented by formula (2). By adding the ring-opening olefin polymer having a glass transition temperature (Tg) lower than that of the norbornene-based polymer, the glass transition temperature (Tg) of the first resin layer is lowered and the flexibility (at room temperature) of the first resin layer is enhanced. According to this configuration, bending resistance of the substrate 10 can be enhanced, and fracture elongation or brittle fracture hardly occurs.

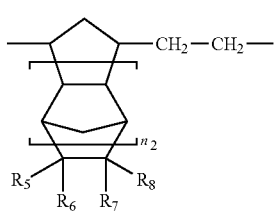

(2)

In formula (2), each of substituents $R_5$, $R_6$, $R_7$, and $R_8$ represents (1) hydrogen, (2) a linear or branched organic group, or (3) a group containing a group selected from derivatives in which a part of the linear or branched organic group is substituted with a halogen or nitrile group, wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other; and $n_2$ is an integer of 0 to 5.

In addition, the additive may be, for example, a material having a function of lowering a coefficient of thermal expansion of each of the first resin layers 11 to 13 by enhancing a molecular orientation of each of the first resin layers 11 to 13 in a plane direction or the like. Examples of the additive include a glass filter and a liquid crystal polymer (LCP) having a small coefficient of thermal expansion. The coefficient of thermal expansion of each of the first resin layers 11 to 13 in the plane direction (X-axis direction or Y-axis direction) is preferably 10 ppm/° C. to 20 ppm/° C. Since a coefficient of thermal expansion of each of the conductor patterns 31 and 32 that are Cu foils is about 16 ppm/° C., a difference in coefficient of thermal expansion between the first resin layers 11 to 13 and the conductor patterns 31 and 32 can be extremely reduced. Therefore, with this configuration, it is possible to suppress the occurrence of warpage or delamination (or peeling between the resin layers and the conductor patterns) of the substrate 10 due to the difference in coefficient of thermal expansion between the resin layers and the conductor patterns during manufacturing (for example, during heating press), a subsequent heating process (reflow process), and the like.

Further, the additive may be, for example, a material having a function of lowering flammability of each of the first resin layers 11 to 13. The additive is a known flame retardant, and is, for example, an inorganic material such as aluminum hydroxide, magnesium hydroxide, a boron compound, or ammonium carbonate, or an organic material such as a bromine compound or phosphate ester.

<<Modified Example of Surface Treatment>>

In the present embodiment, the example in which the altered portions D1 and D2 altered by a surface treatment to have a low glass transition temperature (Tg) are formed has been described, but the "surface treatment" of the present invention is not limited thereto. In the "surface treatment" of the present invention, for example, an altered portion may be formed by modifying the surface of the first resin layer, or an altered portion may be formed by irradiating the surface of the first resin layer with light (for example, polarized light) to enhance the molecular orientation in a certain direction. In addition, in the "surface treatment" of the present invention, for example, the surfaces of the first resin layers 11 to 13 may be reacted by a chemical treatment. The chemical treatment includes, for example, a case where a crosslinking agent or the like is applied to the surfaces of the first resin layers 11 to 13 to alter the surfaces of the first resin layers 11 to 13.

Second Embodiment

In a second embodiment, an example of a resin multilayer substrate formed by laminating two first resin layers is described.

Figure 5A:
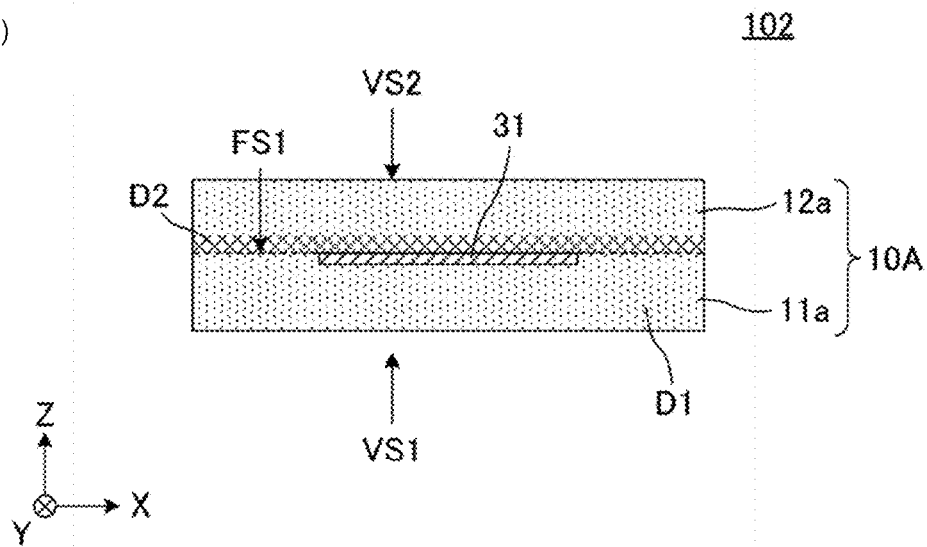
FIG. 5(A) is a sectional view of a resin multilayer substrate 102 according to a second embodiment.
Figure 5B:
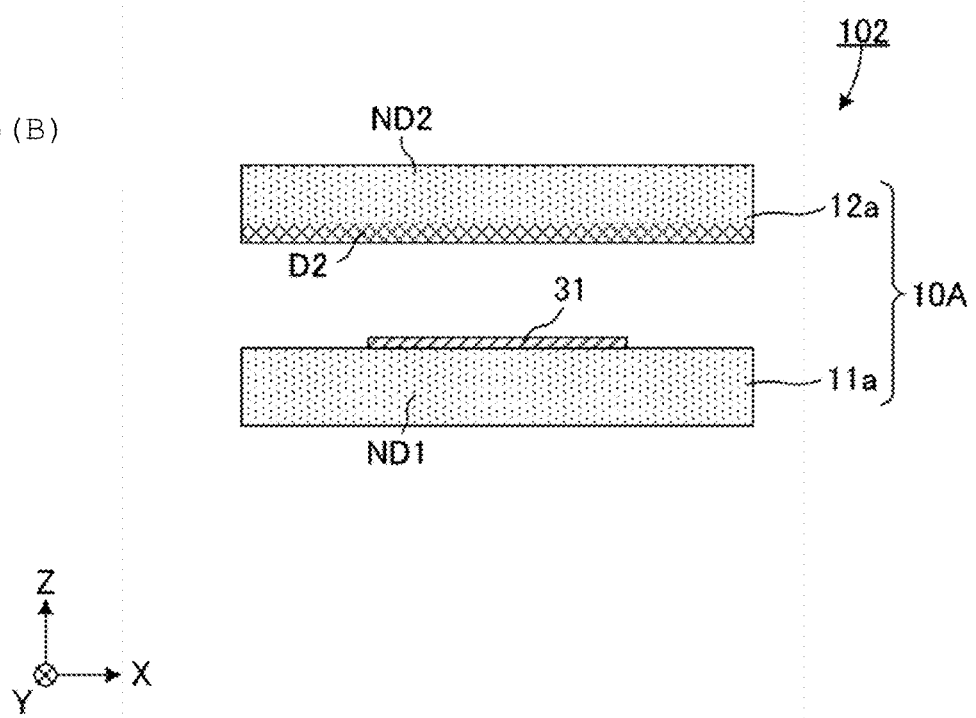
FIG. 5(B) is an exploded sectional view of the resin multilayer substrate 102.

FIG. 5(A) is a sectional view of a resin multilayer substrate 102 according to the second embodiment, and FIG. 5(B) is an exploded sectional view of the resin multilayer substrate 102. In FIGS. 5(A) and 5(B), an altered portion D2 is indicated by cross hatching for easy understanding of a structure.

The resin multilayer substrate 102 is different from the resin multilayer substrate 101 according to the first embodiment in terms of including a substrate 10A. Other configurations of the resin multilayer substrate 102 are substantially the same as those of the resin multilayer substrate 101.

Hereinafter, points different from those of the resin multilayer substrate 101 according to the first embodiment will be described.

The resin multilayer substrate 102 includes a substrate 10A, a conductor pattern 31, and the like. The substrate 10A is formed by sequentially laminating first resin layers 11a and 12a. The first resin layers 11a and 12a are substantially the same as the first resin layers 11 and 12 described in the first embodiment.

The conductor pattern 31 is formed on a surface of the first resin layer 11a. The conductor pattern 31 is the same as that described in the first embodiment. The first resin layer 12a has the altered portion D2 altered by a surface treatment and formed on a rear surface (interface FS1 with the first resin layer 11a adjacent thereto and in close contact therewith in a Z-axis direction). In the present embodiment, the altered portion D2 is formed on the entire rear surface of the first resin layer 12a.

Also with such a configuration, similarly to the resin multilayer substrate 101 according to the first embodiment, a resin multilayer substrate having a high adhesion between the resin layers can be realized.

Third Embodiment

In a third embodiment, an example of a resin multilayer substrate including a second resin layer in addition to the first resin layer is described.

Figure 6A:
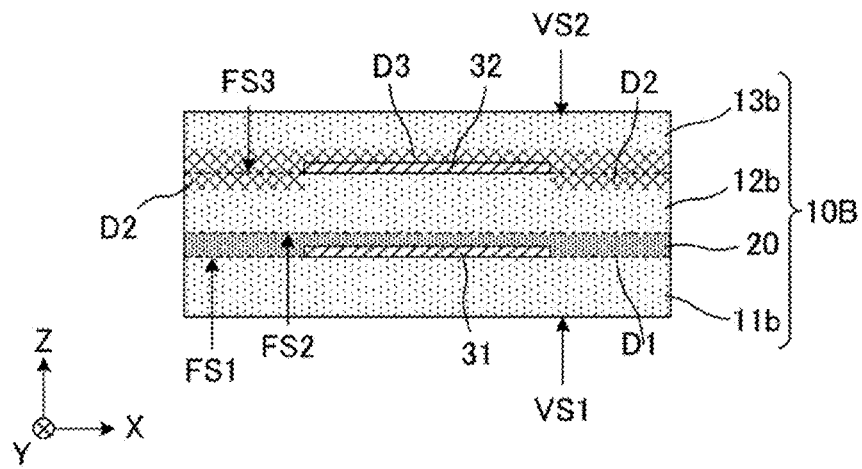
FIG. 6(A) is a sectional view of a resin multilayer substrate 103 according to a third embodiment.
Figure 6B:
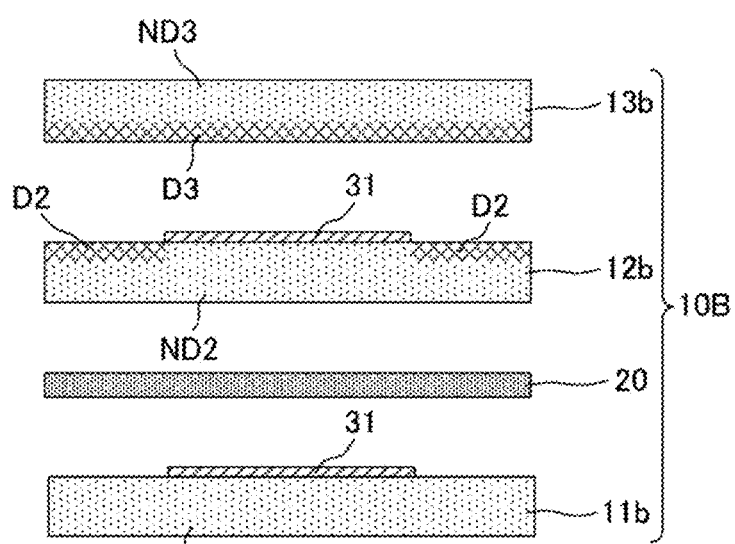
FIG. 6(B) is an exploded sectional view of the resin multilayer substrate 103.

FIG. 6(A) is a sectional view of a resin multilayer substrate 103 according to the third embodiment, and FIG. 6(B) is an exploded sectional view of the resin multilayer substrate 103. In FIGS. 6(A) and 6(B), altered portions D2 and D3 are indicated by cross hatching for easy understanding of a structure.

The resin multilayer substrate 103 is different from the resin multilayer substrate 101 according to the first embodiment in terms of including a substrate 10B. Other points of the resin multilayer substrate 103 are substantially the same as those of the resin multilayer substrate 101.

Hereinafter, points different from those of the resin multilayer substrate 101 according to the first embodiment will be described.

The substrate 10B is formed by sequentially laminating a first resin layer 11b, a second resin layer 20, a first resin layer 12b, and a first resin layer 13b. The first resin layers 11b, 12b, and 13b are the same as the first resin layers 11 to 13 described in the first embodiment. The second resin layer 20 is an adhesive layer having an adhesion to each of the first resin layers 11b to 13b (non-altered portions) higher than an adhesion between the first resin layers 11b to 13b (non-altered portions). The second resin layer 20 is, for example, a resin sheet formed of a fluororesin such as perfluoroalkoxy alkane (PFA) or polytetrafluoroethylene (PTFE), bismaleimide, a styrene elastomer, epoxy, or the like.

In the present embodiment, as illustrated in FIG. 6(B), two first resin layers 11b and 12b adjacent to each other in the Z-axis direction are bonded with the second resin layer 20 interposed therebetween. A thickness of the second resin layer 20 (thickness in the Z-axis direction) is smaller than a thickness of each of the first resin layers 11b to 13b.

Further, the first resin layer 12b has the altered portion D2 formed on a front surface (interface FS3 with the first resin layer 13b adjacent thereto and in close contact therewith in the Z-axis direction), and the first resin layer 13b has the altered portion D3 formed on a rear surface (interface FS3 with the first resin layer 12b adjacent thereto and in close contact therewith in the Z-axis direction). In the present embodiment, the altered portion D2 of the first resin layer 12b and the altered portion D3 of the first resin layer 13b face each other.

As described above, two first resin layers 11b and 12b adjacent to each other in the Z-axis direction may be bonded with the second resin layer 20 (having the adhesion to the first resin layer higher than the adhesion between the first resin layers) interposed therebetween. According to this configuration, as in the case where the altered portion having a high adhesion is provided at the interface between the first resin layers, the adhesion at the interface between the resin layers is increased as compared with the case where the first resin layers (non-altered portions) are directly bonded to each other.

Since the first resin layers 11b to 13b each containing a norbornene-based polymer are excellent in high frequency characteristics as compared with resin layers formed of other materials, it is desirable to bond the first resin layers to each other without using the second resin layer (adhesive layer) in terms of realizing a resin multilayer substrate excellent in high frequency characteristics. In addition, delamination caused by a difference in coefficient of thermal expansion between the resin layers can be suppressed by bonding the first resin layers to each other without using the second resin layer. However, as described in the present embodiment, in the case where two first resin layers 11b and 12b are bonded to each other with the second resin layer 20 interposed therebetween, it is preferable that the thickness of the second resin layer 20 is smaller than the thickness of each of the first resin layers 11b to 13b. By thinning the second resin layer 20, it is possible to realize a resin multilayer substrate having a lower dielectric constant and a lower loss (lower dielectric loss tangent).

The second resin layer 20 is preferably a resin sheet formed of a fluororesin. This is because the resin sheet formed of a fluororesin is excellent in a low dielectric constant, a low loss, and bendability as compared with a sheet formed of another material. The second resin layer 20 may be a resin sheet (for example, a resin obtained by mixing a norbornene-based polymer and a fluororesin) containing a fluororesin.

The second resin layer 20 may be a layer obtained by adding a material having a function of enhancing UV absorbency to the first resin layer as an additive and performing laser irradiation or light irradiation. In this case, the second resin layer 20 is obtained by causing a transesterification reaction of the entire first resin layer by laser irradiation or light irradiation. That is, the entire second resin layer 20 has the same structure as that of the altered portion of the first resin layer. Therefore, the structure of the second resin layer 20 is different from the structure in which the altered portion D1 is formed at a part of the surface of the first resin layer 11 as illustrated in FIG. 2. In addition, the second resin layer 20 may be obtained by causing a transesterification reaction of the entire first resin layer by heating.

In addition, as in the resin multilayer substrate 103 according to the present embodiment, both of two first resin layers 12b and 13b that are adjacent to and in close contact with each other in the Z-axis direction may have the altered portions D2 and D3 at the interface FS3. In the present embodiment, the altered portion D2 of the first resin layer 12b and the altered portion D3 of the first resin layer 13b are in close contact with (bonded to) each other while facing each other in the Z-axis direction. However, the present invention is not limited to this configuration. The altered portions of two first resin layers adjacent to each other in the Z-axis direction may not face each other in the Z-axis direction.

Examples

Hereinafter, the resin multilayer substrate of the present invention will be described with reference to Examples. The inventors of the present application created Comparative Example 1 and Examples 1 to 22 described below as a first experiment in order to clarify the effect exhibited by the resin multilayer substrate according to the present invention. Then, the inventors of the present application measured an adhesive force, a cohesive fracture rate/surface fracture rate, and a coefficient of thermal expansion in a plane direction of each of Comparative Example 1 and Examples 1 to 22.

The coefficient of thermal expansion in the plane direction is represented by the following Equation (A).

$$\Delta L = \alpha L \Delta T \quad (A)$$

Coefficient of thermal expansion in direction in which main surface of resin layer extends (plane direction): $\alpha$ Length of resin layer in direction in which main surface of resin layer extends (plane direction): L Elongation amount of resin layer in direction in which main surface of resin layer extends (plane direction): $\Delta L$ Temperature rise: $\Delta T$ The inventors of the present application measured the coefficient of thermal expansion by the following method. The inventors of the present application prepared a sample cut into a width of 5 mm and a length of 16 mm. Then, the inventors of the present application raised the temperature of the sample from room temperature to 170° C. in a tensile mode at a load of 0.1 N using a thermomechanical analyzer (trade name: TMA Q400) manufactured by TA instruments. Then, the inventors of the present application measured the coefficient of thermal expansion by calculating an average value of the coefficients of thermal expansion within a range of 50° C. to 80° C. in a process of cooling the sample to room temperature. Table 1 is a table showing conditions of Comparative Example 1 and Examples 1 to 22.

TABLE 1

| | First resin layer | | | Additive | | Second resin layer | | |
| --- | --- | --- | --- | --- | --- | --- | --- | --- |
| | Structure | Thickness um | Type | Addition amount phr | Surface treatment | Type | Thickness um | Lamination structure |
| Comparative Example 1 | P-1 | 50 | — | — | — | — | — | — |

TABLE 1-continued

| | First resin layer | | Additive | | | Second resin layer | | Lamination structure |
|---|---|---|---|---|---|---|---|---|
| | Structure | Thickness um | Type | Addition amount phr | Surface treatment | Type | Thickness um | |
| Example 1 | P-1 | 50 | — | — | UV irradiation | — | — | First Embodiment |
| Example 2 | P-1 | 50 | — | — | Plasma discharge | — | — | First Embodiment |
| Example 3 | P-1 | 50 | — | — | Corona discharge | — | — | First Embodiment |
| Example 4 | P-1 | 50 | PIAD | 20 | Plasma discharge | — | — | First Embodiment |
| Example 5 | P-1 | 50 | PIAD | 20 | UV irradiation | — | — | First Embodiment |
| Example 6 | P-1 | 50 | LCP-NF | 10 | Plasma discharge | — | — | First Embodiment |
| Example 7 | P-1 | 50 | LCP-NF | 20 | Plasma discharge | — | — | First Embodiment |
| Example 8 | P-1 | 50 | BN | 20 | Plasma discharge | — | — | First Embodiment |
| Example 9 | P-1 | 50 | — | — | — | PFA | 5 | Third Embodiment |
| Example 10 | P-1 | 50 | — | — | — | SAFY | 5 | Third Embodiment |
| Example 11 | P-1 | 50 | LCP-NF | 20 | — | PFA | 5 | Third Embodiment |
| Example 12 | P-1 | 50 | LCP-NF | 20 | — | SAFY | 5 | Third Embodiment |
| Example 13 | P-1 | 50 | — | — | Plasma discharge | PFA | 5 | Third Embodiment |
| Example 14 | P-1 | 50 | — | — | Plasma discharge | SAFY | 5 | Third Embodiment |
| Example 15 | P-1 | 50 | LCP-NF | 20 | Plasma discharge | PFA | 5 | Third Embodiment |
| Example 16 | P-1 | 50 | LCP-NF | 20 | Plasma discharge | SAFY | 5 | Third Embodiment |
| Example 17 | P-2 | 50 | — | — | Plasma discharge | — | — | First Embodiment |
| Example 18 | P-2 | 50 | LCP-NF | 20 | Plasma discharge | PFA | 5 | Third Embodiment |
| Example 19 | P-3 | 50 | — | — | Plasma discharge | — | — | First Embodiment |
| Example 20 | P-3 | 50 | LCP-NF | 20 | Plasma discharge | PFA | 5 | Third Embodiment |
| Example 21 | P-4 | 50 | — | — | Plasma discharge | — | — | First Embodiment |
| Example 22 | P-4 | 50 | LCP-NF | 20 | Plasma discharge | PFA | 5 | Third Embodiment |

P-1 is Chemical Formula (3).

P-2 is Chemical Formula (4).

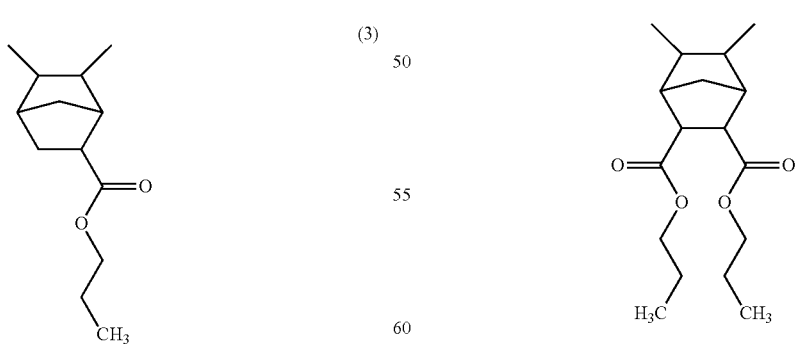

Here, n0 and R1 to R4 are as follows.
n0=0
R1: —C(=O)O—C$_3$H$_7$
R2: —H
R3: —H
R4: —H Here, n0 and R1 to R4 are as follows.
n0=0
R1: —C(=O)O—C$_3$H$_7$
R2: —H
R3: —C(=O)O—C$_3$H$_7$ R4: —HP-3 is Chemical Formula (5).

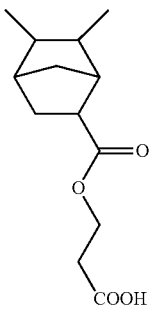

(5)

Here, n0 and R1 to R4 are as follows.
n0=0
R1: —C(=O)O—C$_2$H$_4$—COOH
R2: —H
R3: —H
R4: —H P-4 is Chemical Formula (6).

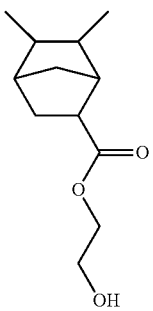

(6)

Here, n0 and R1 to R4 are as follows.
n0=0
R1: —C(=O)O—C$_2$H$_4$—OH
R2: —H
R3: —H
R4: —H Synthesis and film formation of the first resin layers having the structures of P-1 to P-4 are described in, for example, Japanese Patent Application Laid-Open No. 2010-189619 and Japanese Patent Application Laid-Open No. 2010-286837.

In addition, PIAD is a material having a function of enhancing UV absorbency of the resin layer. PIAD is a solvent-soluble polyimide varnish manufactured by Arakawa Chemical Industries, Ltd. LCP-NF and BN are materials having a function of lowering the coefficient of thermal expansion of the resin layer. LCP-NF is, for example, a liquid crystal polymer powder described in Japanese Patent No. 5904307. BN is DENKA Boron Nitride manufactured by Denka Company Limited.

PFA is AGC Fluon+ EA2000 manufactured by AGC Inc. SAFY is Nikaflex SAFY manufactured by NIKKAN INDUSTRIES Co., Ltd.

Table 2 is a table showing experimental results.

TABLE 2

|  | Adhesive force N/mm | Cohesive fracture rate/interface fracture rate % | CTE Ppm/° C. |
|---|---|---|---|
| Comparative Example 1 | 0.2 | 0 | 35 |
| Example 1 | 0.4 | 45 | 35 |
| Example 2 | 0.8 | 82 | 32 |
| Example 3 | 0.6 | 75 | 34 |
| Example 4 | 1.1 | 95 | 29 |
| Example 5 | 0.9 | 90 | 30 |
| Example 6 | 0.9 | 92 | 24 |
| Example 7 | 0.9 | 91 | 17 |
| Example 8 | 0.8 | 89 | 21 |
| Example 9 | 1.2 | 100 | 38 |
| Example 10 | 1.2 | 100 | 39 |
| Example 11 | 1.2 | 100 | 18 |
| Example 12 | 1.3 | 100 | 16 |
| Example 13 | 1.2 | 100 | 38 |
| Example 14 | 1.2 | 100 | 39 |
| Example 15 | 1.2 | 100 | 18 |
| Example 16 | 1.3 | 100 | 16 |
| Example 17 | 0.6 | 80 | 42 |
| Example 18 | 1.4 | 100 | 19 |
| Example 19 | 0.8 | 76 | 39 |
| Example 20 | 1.2 | 100 | 16 |
| Example 21 | 0.7 | 78 | 42 |
| Example 22 | 1.3 | 100 | 16 |

It can be seen that the adhesive force and the cohesive fracture rate/interface fracture rate of each of Examples 1 to 8, Example 15, Example 17, Example 19, and Example 21 are higher than the adhesive force and the cohesive fracture rate/interface fracture rate of Comparative Example 1. The reason is that in Examples 1 to 8, Example 15, Example 17, Example 19, and Example 21, the altered portion altered by the surface treatment by UV irradiation, plasma discharge, or corona discharge is included.

In addition, it can be seen that the adhesive force and the cohesive fracture rate/interface fracture rate of each of Examples 4 and 5 are higher than the adhesive force and the cohesive fracture rate/interface fracture rate of each of Examples 1 and 2.

In addition, it can be seen that the adhesive force and the cohesive fracture rate/interface fracture rate of each of Examples 6 to 8 are higher than the adhesive force and the cohesive fracture rate/interface fracture rate of each of Examples 1 and 2. The reason is that in Examples 6 to 8, the coefficient of thermal expansion (CTE) of the resin layer in the plane direction is reduced by adding LCP-NF or BN.

In addition, it can be seen that the adhesive force and the cohesive fracture rate/interface fracture rate of each of Examples 9 to 16 are higher than the adhesive force and the cohesive fracture rate/interface fracture rate of Comparative Example 1. The reason is that in Examples 9 to 16, the second resin layer is included as an adhesive layer.

It can be seen that the adhesive force and the cohesive fracture rate/interface fracture rate of each of Examples 13 to 16, Example 18, Example 20, and Example 22 are improved by plasma discharge or LCP-NF.

The inventors of the present application created Comparative Example 2 and Examples 23 to 26 described below as a second experiment in order to clarify the effect exhibited by the resin multilayer substrate according to the present invention. Then, the inventors of the present application measured a decrease amount of a glass transition temperature (Tg) (ΔTg), an adhesive force, a cohesive fracture rate/surface fracture rate, and a coefficient of thermal expansion of each of Comparative Example 2 and Examples 23 to 26. Table 3 is a table showing conditions of Comparative Example 2 and Examples 23 to 26.

TABLE 3

| | Resin layer | | Additive | | Altered portion | | Additive | |
| | Structure | Thickness um | Type | Addition amount phr | Type | a/b | Thickness um | Type | Addition amount phr |
|---|---|---|---|---|---|---|---|---|---|
| Comparative Example 2 | P-1 | 50 | | | P-1 | | 5 | | |
| Example 23 | P-1 | 50 | | | P-5 | 80/20 | 5 | | |
| Example 24 | P-1 | 50 | LCP-NF | 20 | P-5 | 80/20 | 5 | LCP-NF | 20 |
| Example 25 | P-1 | 50 | | | P-5 | 60/40 | 5 | | |
| Example 26 | P-1 | 50 | LCP-NF | 20 | P-5 | 60/40 | 5 | LCP-NF | 20 |

P-5 is Chemical Formula (7).

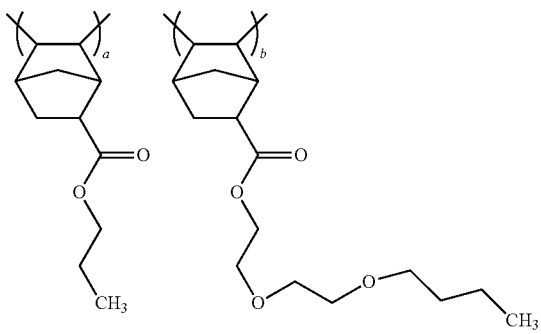

(7)

Here, n0 and R1 to R4 are as follows.
In a,
n0=0
R1: —C(=O)O—$C_2H_4$—OH
R2: —H
R3: —H
R4: —H
In b,
n0=0
R1: —C(=O)O—$C_2H_4OC_2H_4O$—$C_4H_9$
R2: —H
R3: —H
R4: —H In Examples 23 to 26, the altered portion was formed in the first resin layer as shown in Table 3. Therefore, the first resin layer of the single-sided copper clad plate containing 100 parts by weight of P-1 and 10 parts by weight of diethylene glycol monobutyl ether was irradiated with a xenon flash lamp. The thickness of the first resin layer was 50 μm. Therefore, the resin was reacted with the additive in the vicinity of the surface layer of the first resin layer, and the altered portion having a structure of P-5 was formed in the vicinity of the surface layer of the first resin layer. In Examples 23 to 26, the thickness of the altered portion was 5 μm. The intensity of the xenon flash lamp and the heat generated by the xenon flash lamp are attenuated as the depth from the surface layer of the first resin layer increases. Therefore, the altered portion having a structure of P-5 is formed in the vicinity of the surface layer of the first resin layer. However, as the distance from the surface layer of the first resin layer increases, a proportion of P-5 decreases and a proportion of P-1 increases. That is, a gradient is generated in the composition of P-5 and P-1. The gradient was generated in the composition of P-5 and P-1 in a range of 5 μm from the surface layer of the first resin layer. a/b is a mass of P-1 in the surface layer of the first resin layer/a mass of P-5 in the surface layer of the first resin layer.

The inventors of the present application measured the decrease amount of the glass transition temperature (Tg) (ΔTg) and the coefficient of thermal expansion using such a first resin layer in which the altered portion was formed. Further, the inventors of the present application measured the adhesive force and the cohesive fracture rate/surface fracture rate by bonding such a first resin layer in which the altered portion was formed and the resin layer in which the altered portion was not formed.

Table 4 is a table showing experimental results.

TABLE 4

| | ΔTg °C. | Adhesive force N/mm | Cohesive fracture rate/interface fracture rate % | CTE ppm/°C. |
|---|---|---|---|---|
| Comparative Example 2 | 0 | 0.2 | 0 | 36 |
| Example 23 | 20 | 1.1 | 96 | 42 |
| Example 24 | 20 | 1.1 | 98 | 17 |
| Example 25 | 39 | 1.1 | 98 | 45 |
| Example 26 | 39 | 1.1 | 98 | 16 |

It can be seen that the adhesive force and the cohesive fracture rate/interface fracture rate of each of Examples 23 to 26 are higher than the adhesive force and the cohesive fracture rate/interface fracture rate of Comparative Example 2. The reason is that in Examples 23 to 26, the altered portion is included. As described above, it can be seen that the adhesive force and the cohesive fracture rate/interface fracture rate of the resin multilayer substrate are also improved by the altered portion obtained by altering the structure of P-1 to the structure of P-5 by the transesterification reaction by heating.

In addition, as described in Examples 25 and 26, ΔTg increases as a/b decreases. This means that the molecular mobility of the first resin layer with respect to heat is increased and the adhesion between the first resin layers is increased.

It can be seen that in Examples 24 and 26, the coefficient of thermal expansion (CTE) of the first resin layer in the plane direction is reduced by adding LCP-NF or BN.

The inventors of the present application created Comparative Example 3 and Examples 27 to 29 described below as a third experiment in order to clarify the effect exhibited by the resin multilayer substrate according to the present invention. Then, the inventors of the present application measured a decrease amount of a glass transition temperature (Tg) (ΔTg), an adhesive force, a cohesive fracture rate/surface fracture rate, and a coefficient of thermal expansion in a plane direction of each of Comparative Example 3 and Examples 27 to 29. Table 5 is a table showing conditions of Comparative Example 3 and Examples 27 to 29.

TABLE 5

| | Resin layer | | Additive | | Altered portion | |
| --- | --- | --- | --- | --- | --- | --- |
| | Structure | Thickness um | Type | Addition amount phr | Type a/b | Thickness um |
| Comparative Example 3 | P-1 | 50 | Diethylene glycol monobutyl ether | 10 | P-1 — | 5 |
| Example 27 | P-1 | 50 | Diethylene glycol monobutyl ether | 10 | P-5 95/5 | 5 |
| Example 28 | P-1 | 50 | Diethylene glycol monobutyl ether | 20 | P-5 86/14 | 5 |
| Example 29 | P-1 | 50 | Diethylene glycol monobutyl ether | 30 | P-5 80/20 | 5 |

In Examples 27 to 29, the altered portion was formed in the first resin layer as shown in Table 5. Therefore, the surface of the first resin layer of the single-sided copper clad plate containing P-1 and diethylene glycol monobutyl ether was irradiated with a xenon flash lamp. The thickness of the first resin layer was 50 μm. In this case, an addition amount of ethylene glycol monobutyl ether was changed to 10 phr to 30 phr. Therefore, the resin was reacted with the additive in the vicinity of the surface layer of the first resin layer, and the altered portion having a structure of P-5 was formed in the vicinity of the surface layer of the first resin layer. In Examples 27 to 29, the thickness of the altered portion was 5 μm. The intensity of the xenon flash lamp and the heat generated by the xenon flash lamp are attenuated as the depth from the surface layer of the first resin layer increases. Therefore, the altered portion having a structure of P-5 is formed in the vicinity of the surface layer of the first resin layer. However, as the distance from the surface layer of the first resin layer increases, a proportion of P-5 decreases and a proportion of P-1 increases. That is, a gradient is generated in the composition of P-5 and P-1. The gradient was generated in the composition of P-5 and P-1 in a range of 5 μm from the surface layer of the first resin layer. a/b is a mass of P-1 in the surface layer of the first resin layer/a mass of P-5 in the surface layer of the first resin layer.

The inventors of the present application measured the decrease amount of the glass transition temperature (Tg) (ΔTg) and the coefficient of thermal expansion using such a first resin layer in which the altered portion was formed. Further, the inventors of the present application measured the adhesive force and the cohesive fracture rate/surface fracture rate by bonding such a first resin layer in which the altered portion was formed and the resin layer in which the altered portion was not formed.

Table 6 is a table showing experimental results.

TABLE 6

| | ΔTg ° C. | Adhesive force N/mm | Cohesive fracture rate/interface fracture rate % | CTE ppm/° C. |
| --- | --- | --- | --- | --- |
| Comparative Example 3 | 0 | 0.2 | 0 | 36 |
| Example 27 | 11 | 1.1 | 96 | 42 |
| Example 28 | 20 | 1.1 | 98 | 38 |
| Example 29 | 39 | 1.1 | 95 | 40 |

It can be seen that the adhesive force and the cohesive fracture rate/interface fracture rate of each of Examples 27 to 29 are higher than the adhesive force and the cohesive fracture rate/interface fracture rate of Comparative Example 3. The reason is that in Examples 27 to 29, the altered portion is included. As described above, it can be seen that the adhesive force and the cohesive fracture rate/interface fracture rate of the resin multilayer substrate are also improved by the altered portion obtained by altering the structure of P-1 to the structure of P-5 by the transesterification reaction by heating.

In addition, as described in Examples 27 and 29, ΔTg increases as a/b decreases. This means that the molecular mobility of the first resin layer with respect to heat is increased and the adhesion between the first resin layers is increased.

A method for manufacturing a resin multilayer substrate of each of Examples 23 to 29 is as follows. A plurality of resin layers include at least one first resin layer 12 obtained using a norbornene-based polymer having at least one repeating unit represented by the following formula (1).

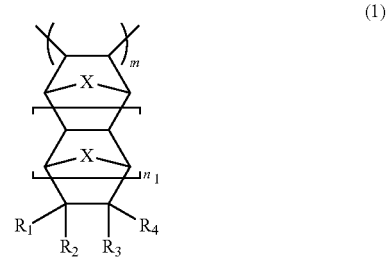

(1)

in formula (1), X represents O, —CH$_2$—, or —CH$_2$—CH$_2$—, each of substituents $R_1$, $R_2$, $R_3$, and $R_4$ represents hydrogen, a linear or branched organic group, or a group containing a group selected from derivatives in which a part of the organic group is substituted with a halogen or nitrile group, the organic group is an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, these groups may be bonded through an alkyl group, an ether group, or an ester group and may be the same as or different from each other, m is an integer of 10 to 10,000, and $n_1$ is an integer of 0 to 5.

In addition, the first resin layer 12 contains an additive that reacts with the norbornene-based polymer. The additive is PIAD or ethylene glycol monobutyl ether. Then, the norbornene-based polymer of the first resin layer 12 is reacted with the additive by the surface treatment, and a gradient is generated in the composition of the material (P-1) before the reaction and the material (P-5) after the reaction in the thickness direction according to attenuation of an effect of the surface treatment. Examples of the surface treatment include heating and UV irradiation. The chemical reaction of the surface treatment is a transesterification reaction by heating, a UV curing reaction by UV irradiation, or the like. As in Examples 23 to 29, examples of a method of forming the altered portion in a part of the first resin layer 12 include the following methods. For example, in the case of the transesterification reaction by heat, there is a method of heating and thermally diffusing only the surface of the first resin layer 12 by irradiation with high energy at a short pulse, such as a xenon flash lamp. In addition, there is a method of forming an altered portion in a part of the first resin layer 12 by absorption of irradiation energy into the first resin layer 12, such as a near infrared irradiation treatment or an infrared irradiation treatment. On the other hand, in the case of the energy reaction by UV curing, there is a method of forming an altered portion in a part of the first resin layer 12 by absorption of irradiation energy. An example of the xenon flash lamp includes an instant heating and high-temperature firing flash lamp anneal manufactured by Ushio, Inc. In addition, an example of a near infrared irradiation treatment manufactured by Matsumoto Kinzoku Kogyo Co., Ltd. includes an ultra near infrared heating device. According to these methods, a gradient is generated in the composition of the material (P-1) before the reaction and the material (P-5) after the reaction in the thickness direction.

Other Embodiments

In each of the embodiments described above, the example in which the substrate is a rectangular or substantially rectangular flat plate has been described, but the shape of the substrate is not limited thereto. The shape of the substrate can be appropriately changed within a range in which the action and effect of the present invention are exhibited. The planar shape of the substrate may be, for example, a polygon, a circle, an ellipse, an L shape, a U shape, a crank shape, a T shape, a Y shape, or the like.

In addition, in each of the embodiment described above, the example of the substrate formed by laminating three first resin layers or the substrate formed by laminating three first resin layers and one second resin layer has been described, but the substrate of the present invention is not limited to this configuration. The number of first resin layers and the number of second resin layers for forming the substrate can be appropriately changed. In addition, a protective layer such as a cover lay film or a resist film may be formed on the surface of the substrate.

In addition, the circuit configuration formed in the resin multilayer substrate is not limited to the configuration of each of the embodiments described above, and can be appropriately changed within the scope of exhibiting the action and effect of the present invention. In the circuit formed in the resin multilayer substrate, for example, a coil (inductor) formed with a conductor pattern, a capacitor, or a frequency filter such as various filters (a low pass filter, a high pass filter, a band pass filter, and a band elimination filter) may be formed. In addition, various transmission lines (a strip line, a micro-strip line, a coplanar line, and the like) may be formed in the resin multilayer substrate. Further, various electronic components such as chip components may be mounted or embedded in the resin multilayer substrate.

The shape, position, and number of each of the conductor patterns 31 and 32 are not limited to the configuration of each of the embodiments described above, and can be appropriately changed within the scope of exhibiting the action and effect of the present invention. The planar shape of the conductor pattern may be, for example, a polygon, a circle, an ellipse, an arc shape, a ring shape, an L shape, a U shape, a T shape, a crank shape, or the like. In addition, in each of the embodiment described above, the example in which the conductor patterns 31 and 32 are formed inside the substrate has been described, but the conductor pattern (including an electrode for external connection) may be formed on the surface of the substrate. Further, the resin multilayer substrate may include a dummy electrode (dummy conductor) that is not connected to the circuit.

In addition, in each of the embodiments described above, the example of the interlayer connection conductor V1 obtained by solidifying the conductive paste disposed (filled) in the hole provided in the first resin layer 12 by the heating press treatment has been described, but the interlayer connection conductor is not limited thereto. The interlayer connection conductor formed in the resin multilayer substrate may be, for example, a conductor or the like having a plated via (through-hole plating or filled via plating) provided in the hole formed in the resin layer by a plating treatment and a conductive bonding material bonded to the plated via (or a metal pin or the like) and a plated via.

In the resin multilayer substrate 101 of FIG. 6, at least one first resin layer among the plurality of first resin layers 11b to 13b may be bonded to the second resin layer 20. For example, in the resin multilayer substrate 101 of FIG. 6, the third resin layer may be bonded to the second resin layer 20 instead of the first resin layer 11b. In this case, one first resin layer 12b is bonded to the second resin layer 20.

In the resin multilayer substrate 101 of FIG. 6, the altered portions D2 and D3 are not essential.

Finally, the description of the embodiment described above is illustrative in all respects and is not restrictive. Modifications and alternations can be appropriately made by those skilled in the art. The scope of the present invention is defined not by the embodiments described above but by the scope of the claims. Further, the scope of the present invention includes alternations from the embodiments within the scope equivalent to the scope of the claims.

DESCRIPTION OF REFERENCE SYMBOLS

CN1, CN2: Connection portion
SL: Line portion
D1, D2, D3: Altered portion
ND1, ND2, ND3: Non-altered portion
FS1, FS2, FS3: Interface
V1: Interlayer connection conductor
VS1: First main surface
VS2: Second main surface
1: Housing
2: Battery pack
10, 10A, 10B: Substrate
11, 11a, 11b, 12, 12a, 12b, 13, 13b: First resin layer
20: Second resin layer
31, 32: Conductor pattern
51, 52: Plug
61, 62: Receptacle
71, 72: Electronic component 101, 101A, 102, 103: Resin multilayer substrate
201, 202: Circuit board
301: Electronic device

The invention claimed is:

1. A resin multilayer substrate comprising:
a substrate having a plurality of laminated resin layers,
wherein the plurality of laminated resin layers include two first resin layers adjacent to each other in a lamination direction among the plurality of laminated resin layers, the two first resin layers each comprising a norbornene-based polymer having at least one repeating unit represented by the following formula (1):

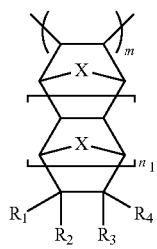

(1)

where
X represents O, —$CH_2$—, or —$CH_2$—$CH_2$—,
each of substituents $R_1$, $R_2$, $R_3$, and $R_4$ represents (1) hydrogen, (2) a linear or branched organic group, or (3) a group containing a group selected from derivatives in which a part of the linear or branched organic group is substituted with a halogen or nitrile group,
wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other,
m is an integer of 10 to 10,000, and
$n_1$ is an integer of 0 to 5,
at least one of the two first resin layers that are adjacent to each other in the lamination direction has an interface with an altered portion, and
an adhesion at the interface having the altered portion is greater than an adhesion at an interface with a non-altered portion.

2. The resin multilayer substrate according to claim 1, wherein both of the two first resin layers have the altered portion at the interface.

3. The resin multilayer substrate according to claim 1, wherein the altered portion has a glass transition temperature lower than that of the interface with the non-altered portion.

4. The resin multilayer substrate according to claim 1, wherein the altered portion has more functional groups than the interface with the non-altered portion.

5. The resin multilayer substrate according to claim 1, wherein the altered portion has a loss tangent greater than that of the interface with the non-altered portion.

6. The resin multilayer substrate according to claim 1, wherein each of the plurality of first resin layers includes an additive that enhances UV absorbency of each of the plurality of resin layers.

7. The resin multilayer substrate according to claim 1, wherein each of the plurality of first resin layers includes an additive that enhances flexibility of each of the plurality of resin layers.

8. The resin multilayer substrate according to claim 1, further comprising:
a conductor pattern in the substrate; and
wherein each of the plurality of first resin layers includes an additive that lowers a coefficient of thermal expansion of each of the plurality of resin layers.

9. The resin multilayer substrate according to claim 8, wherein a coefficient of thermal expansion of each of the plurality of resin layers in a plane direction is 10 ppm/° C. to 20 ppm/° C.

10. The resin multilayer substrate according to claim 1, wherein the substrate has a bent portion.

11. A resin multilayer substrate comprising:
a substrate having a plurality of laminated resin layers,
wherein the plurality of laminated resin layers include a plurality of first resin layers and a second resin layer, where at least one first resin layer of the plurality of first resin layers is bonded to the second resin layer, and the plurality of first resin layers comprise a norbornene-based polymer having at least one repeating unit represented by the following formula (1):

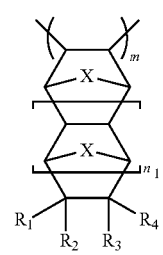

(1)

where
X represents O, —$CH_2$—, or —$CH_2$—$CH_2$—,
each of substituents $R_1$, $R_2$, $R_3$, and $R_4$ represents (1) hydrogen, (2) a linear or branched organic group, or (3) a group containing a group selected from derivatives in which a part of the linear or branched organic group is substituted with a halogen or nitrile group,
wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other,
m is an integer of 10 to 10,000, and
$n_1$ is an integer of 0 to 5, and
an adhesion of the second resin layer to the at least one first resin layer is higher than an adhesion between the plurality of first resin layers.

12. The resin multilayer substrate according to claim 11, wherein at least two first resin layers adjacent to each other in a lamination direction among the plurality of first resin layers are bonded to each other.

13. The resin multilayer substrate according to claim 11, wherein a thickness of the second resin layer is smaller than a thickness of each of the plurality of first resin layers.

14. The resin multilayer substrate according to claim 11, wherein the second resin layer contains a fluororesin.

15. The resin multilayer substrate according to claim 11, wherein each of the plurality of first resin layers includes an additive that enhances UV absorbency of each of the plurality of resin layers.

16. The resin multilayer substrate according to claim 11, wherein each of the plurality of first resin layers includes an additive that enhances flexibility of each of the plurality of resin layers.

17. The resin multilayer substrate according to claim 11, further comprising:
   a conductor pattern in the substrate; and
   wherein each of the plurality of first resin layers includes an additive that lowers a coefficient of thermal expansion of each of the plurality of resin layers.

18. The resin multilayer substrate according to claim 17, wherein a coefficient of thermal expansion of each of the plurality of resin layers in a plane direction is 10 ppm/° C. to 20 ppm/° C.

19. The resin multilayer substrate according to claim 11, wherein the substrate has a bent portion.

20. A method for manufacturing a resin multilayer substrate, the method comprising:
   forming a substrate by laminating a plurality of resin layers together,
   wherein the plurality of resin layers include two first resin layers adjacent to each other in a lamination direction among the plurality of laminated resin layers, the two first resin layers each comprising a norbornene-based polymer having at least one repeating unit represented by the following formula (1):

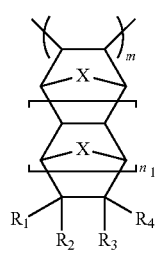

(1)

where
X represents O, —CH$_2$—, or —CH$_2$—CH$_2$—,
each of substituents R$_1$, R$_2$, R$_3$, and R$_4$ represents (1) hydrogen, (2) a linear or branched organic group, or (3) a group containing a group selected from derivatives in which a part of the linear or branched organic group is substituted with a halogen or nitrile group,
wherein the linear or branched organic group is: an organic group containing an alkyl group, an alkenyl group, an alkynyl group, an aryl group, an aralkyl group, an alkoxysilyl group, or an epoxy group, an organic group containing an ether group, an organic group containing a (meth)acrylic group, an organic group containing an ester group, or an organic group containing a ketone group, and these groups may be bonded through an alkyl group, an ether group, or an ester group and may be the same as or different from each other,
m is an integer of 10 to 10,000, and
n$_1$ is an integer of 0 to 5, and
reacting the norbornene-based polymer of at least one of the two first resin layers with an additive by a surface treatment to generate a gradient in a composition of the at least one of the two first resin layers between a material before the reaction and the material after the reaction in a thickness direction according to attenuation of an effect of the surface treatment.

* * * * *